(12) United States Patent
Trampitsch

(10) Patent No.: US 8,890,577 B1
(45) Date of Patent: Nov. 18, 2014

(54) BIPOLAR ISOLATED HIGH VOLTAGE SAMPLING NETWORK

(71) Applicant: Linear Technology Corporation, Milpitas, CA (US)

(72) Inventor: Gerd Trampitsch, Unterfoehring (DE)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 14/157,316

(22) Filed: Jan. 16, 2014

Related U.S. Application Data

(60) Provisional application No. 61/897,067, filed on Oct. 29, 2013.

(51) Int. Cl.
*H03K 5/00* (2006.01)
*H03K 17/00* (2006.01)

(52) U.S. Cl.
USPC .......................................................... 327/94

(58) Field of Classification Search
USPC .................. 327/91, 94–97; 341/122–124
See application file for complete search history.

(56) References Cited

U.S. PATENT DOCUMENTS

| | | | |
|---|---|---|---|
| 3,737,893 A | 6/1973 | Belet et al. | |
| 5,184,128 A | 2/1993 | Snow | |
| 6,232,907 B1 | 5/2001 | Nagaraj et al. | |
| 7,119,585 B2 * | 10/2006 | Ranganathan | 327/94 |
| 7,176,742 B2 | 2/2007 | Aksin et al. | |
| 7,532,042 B2 * | 5/2009 | Lee | 327/91 |
| 8,022,679 B2 | 9/2011 | Sachdev et al. | |
| 2013/0009623 A1 | 1/2013 | Birk et al. | |

FOREIGN PATENT DOCUMENTS

EP 2533248 A2 12/2012

OTHER PUBLICATIONS

Yen, Robert C. et al., "A MOS Switched-Capacitor Instrumentation Amplifier", IEEE Journal of Solid State Circuits, vol. SC-17, No. 6, Dec. 1982, pp. 1008-1013.
International Search Report for European Patent Application 14158410.2-1805, dated Jul. 4, 2014, 8 pages.

* cited by examiner

*Primary Examiner* — Quan Tra
(74) *Attorney, Agent, or Firm* — Edward C. Kwok; Hogan Lovells US LLP

(57) ABSTRACT

A method and a circuit achieve fully isolated sampling of bipolar differential voltage signals. The isolated sampling network is suitable for applications in which sampling signals far outside of the supply voltages are desired. A sampling network of the present invention may sample a differential signal between voltages $-V_{DSMAX}$ and $V_{DSMAX}$, even with common mode voltages that exceed the supply voltage (e.g., an input stage of an ADC). The bipolar isolated input sampling network may include a polarity comparator and sampling switches that operate as rectifiers. Rectification ensures that a unipolar sampling network needs only to sample signals of predetermined voltage levels.

18 Claims, 7 Drawing Sheets

BIPOLAR ISOLATED HIGH VOLTAGE SAMPLING NETWORK

CROSS REFERENCE TO RELATED APPLICATIONS

The present application relates to and claims priority of U.S. provisional patent application ("Provisional Application"), Ser. No. 61/897,067, entitled "Bipolar Isolated High Voltage Sampling Network," filed on Oct. 29, 2013. The disclosure of Provisional Application is incorporated by reference in its entirety.

BACKGROUND OF THE INVENTION

1. Field of the Invention

The present invention relates to isolated sampling of differential input signals. In particular, the present invention relates to isolated sampling of differential input signals in a sampling network, such as an input stage of an analog-to-digital converter (ADC).

2. Discussion of the Related Art

FIG. 1 is a schematic diagram of a differential double-correlated sampling instrumentation amplifier (circuit 100) disclosed in the article ("the Yen article"), entitled "A MOS Switched-Capacitor Instrumentation Amplifier," by R. C. Yen and P. R. Gray, published in the *IEEE Journal of Solid State Circuits*, pp. 1008-13, December, 1982. As shown in FIG. 1, circuit 100 of FIG. 1 shorts the input terminals $V_{IN}^+$ and $V_{IN}^-$ with switch S3 that is controlled by a signal $\phi_2$. Signal $\phi_2$ is a logic signal that swings within the power supply voltages. As circuit 100 does not use charge pumps for controlling the input sampling network, circuit 100 is unable to sample far outside of the power supply voltages.

FIG. 2 shows a prior art ADC driver circuit that receives a single-ended input signal to provide a differential signal for an ADC. As shown in FIG. 2, the ADC driver circuit requires resistive dividers and an additional buffer amplifier to limit the differential voltage at the ADC input terminals to a voltage swing that is close to that of the ADC's supply voltages.

SUMMARY

According to one embodiment of the present invention, a method and a circuit achieve fully isolated sampling of bipolar differential voltage signals. The isolated sampling network is suitable for applications in which sampling signals far outside of the supply voltages is desired. A sampling network of the present invention may sample a differential signal between voltages $-V_{DSMAX}$ and $V_{DSMAX}$, even with common mode voltages that exceed the supply voltage (e.g., an input stage of an ADC). The bipolar isolated input sampling network may include a polarity comparator and sampling switches that operate as rectifiers. Rectification ensures that a unipolar sampling network needs only to sample signals of predetermined voltage levels. A sampling network of the present invention may sample a differential signal between voltages $-V_{DSMAX}$ and $V_{DSMAX}$, even with common mode voltages that exceed the supply voltage. In one implementation, an ADC with a maximum supply voltage of 3V is able to sample differential signals of ±3V or more at a common mode voltage of 10V.

A bipolar isolated sampling network of the present invention may sample a differential input signal having a voltage swing between minus $V_{DSMAX}$ to plus $V_{DSMAX}$. Such a sampling network (i) has better noise and increased linearity, as no resistive divider or buffer amplifier is needed, (ii) has lower power consumption and less aging and drift, due to its shorter analog signal processing chain, and (iii) allows sampling of signals far beyond the power supply voltage. In one embodiment, the source terminals of the sampling switches are connected to low impedance points, so that local charge pumps may be connected to control the gate voltage of the sampling switches relative to the potential at the source terminals of the sampling switches.

The present invention is better understood upon consideration of the detailed description below, in conjunction with the accompanying drawings.

DETAILED DESCRIPTION OF THE PREFERRED EMBODIMENTS

Figure 1:
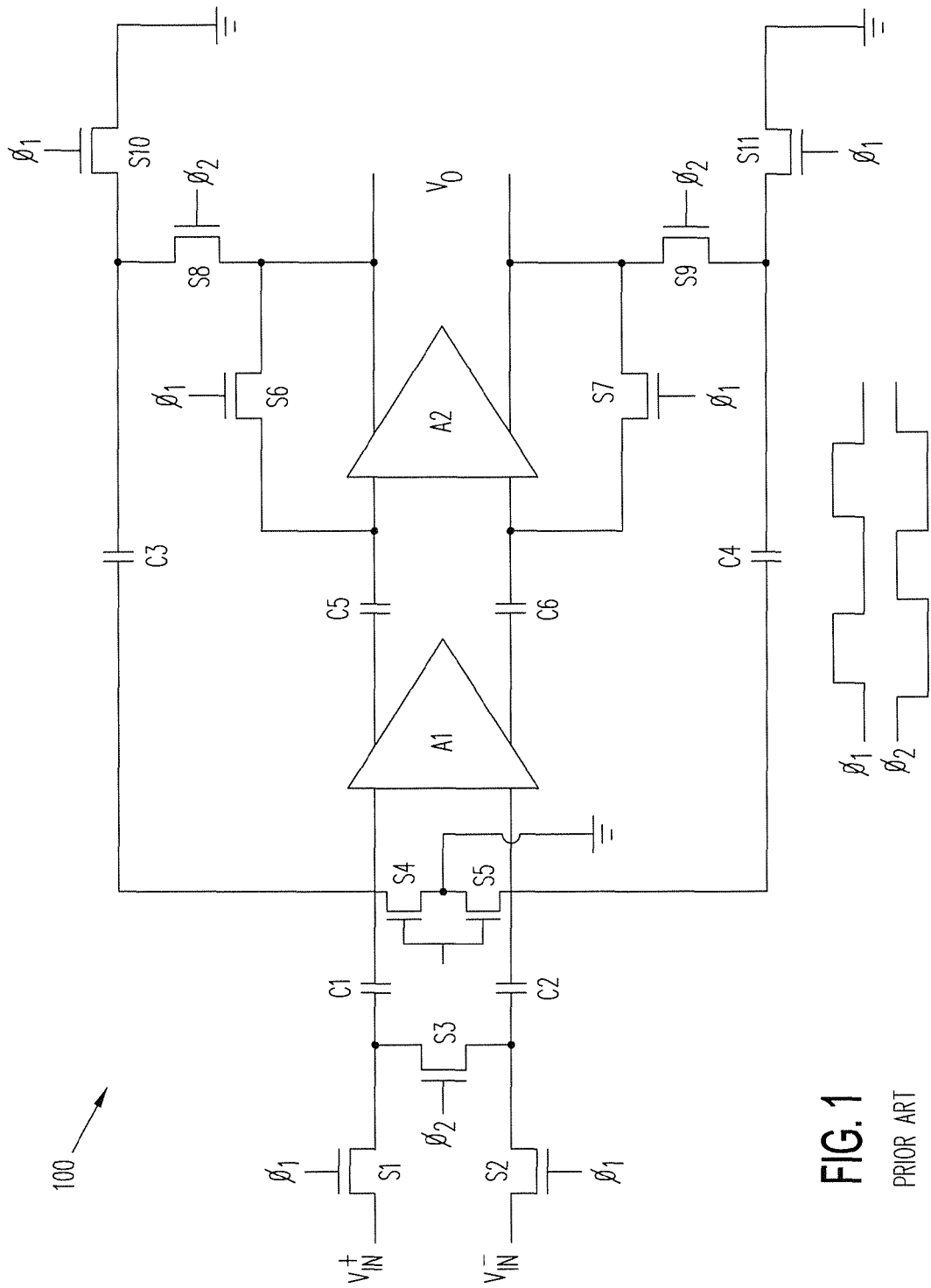
FIG. 1 is a schematic diagram of a differential double-correlated sampling instrumentation amplifier (circuit 100) disclosed in the prior art.
Figure 2:
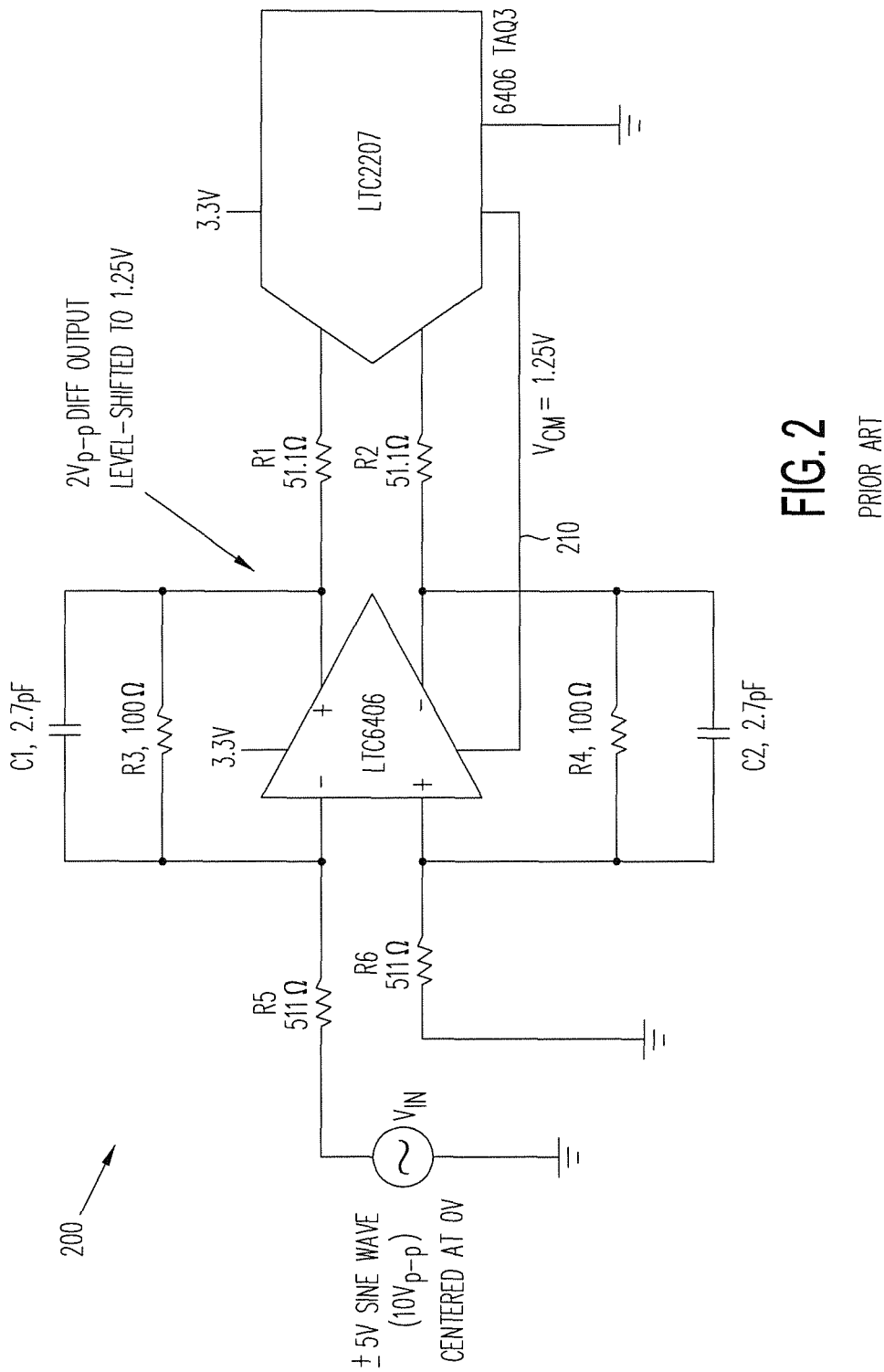
FIG. 2 shows a prior art ADC driver that receives a single-ended input signal to provide a differential signal for an ADC.
Figure 3:
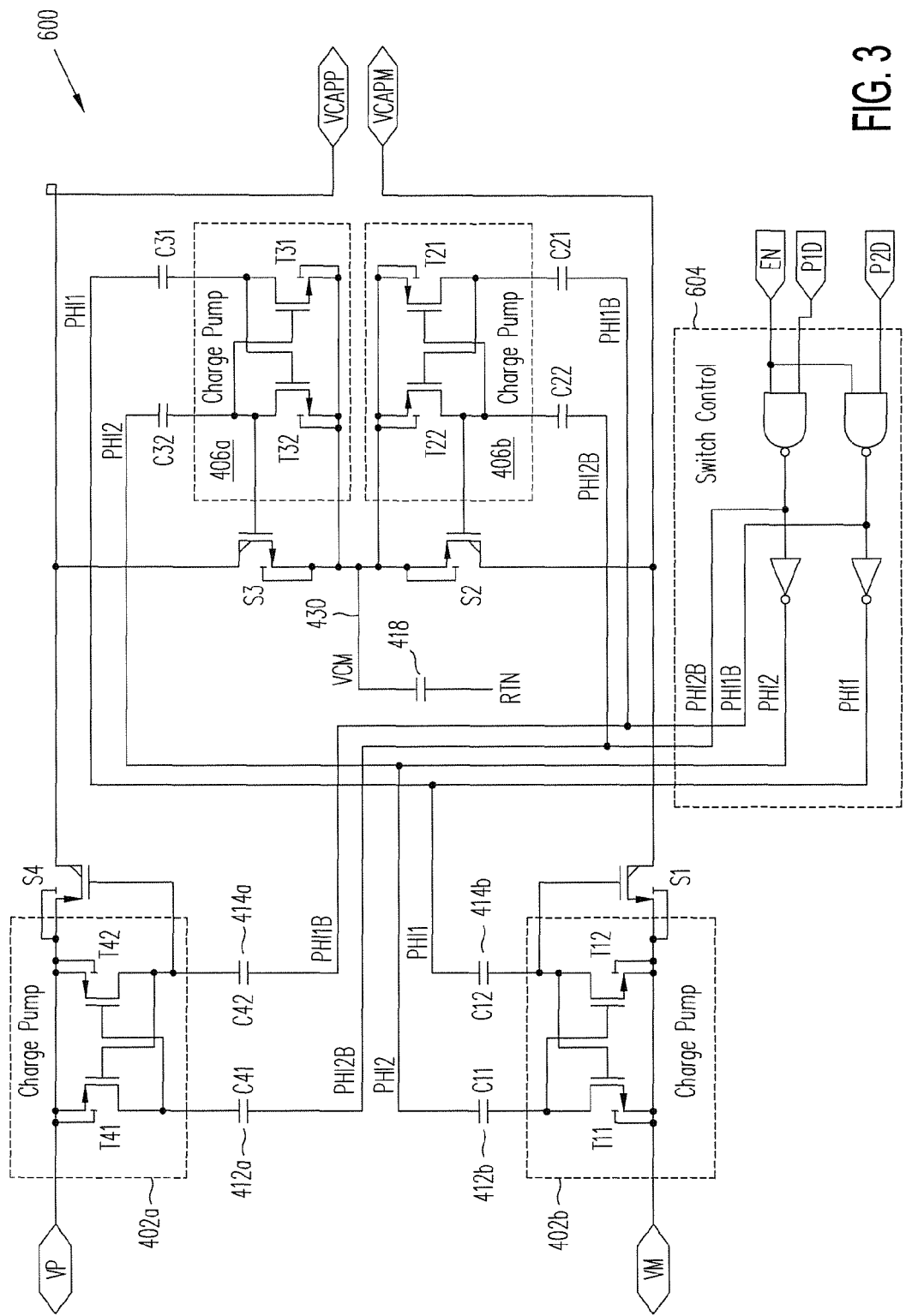
FIG. 3 shows isolated sampling network 600 disclosed in a copending patent application by the present inventor.

FIG. 3 shows isolated sampling network 600 disclosed in the present inventor's copending patent application ("Copending Patent Application"), entitled "ISOLATED HIGH VOLTAGE SAMPLING NETWORK," Ser. No. 13/841,459, filed Mar. 15, 2013. The Copending Patent Application is hereby incorporated by reference in its entirety. Isolated sampling network 600 can sample differential signals from minus two diode drops up to two times the maximum drain-to-source voltage ($V_{DSMAX}$) for a given technology in which isolated sampling network 600 is implemented. As shown in FIG. 3, PMOS device S4 samples positive input terminal VP and NMOS device S1 samples negative input terminal VM. Body diodes of PMOS device S4 and NMOS device 51 turn on when the differential input voltage across positive input terminal VP and negative input terminal VM reaches minus two diode drops, thereby constraining the negative differential voltage that can be sampled to minus two diode drops.

Figure 4:
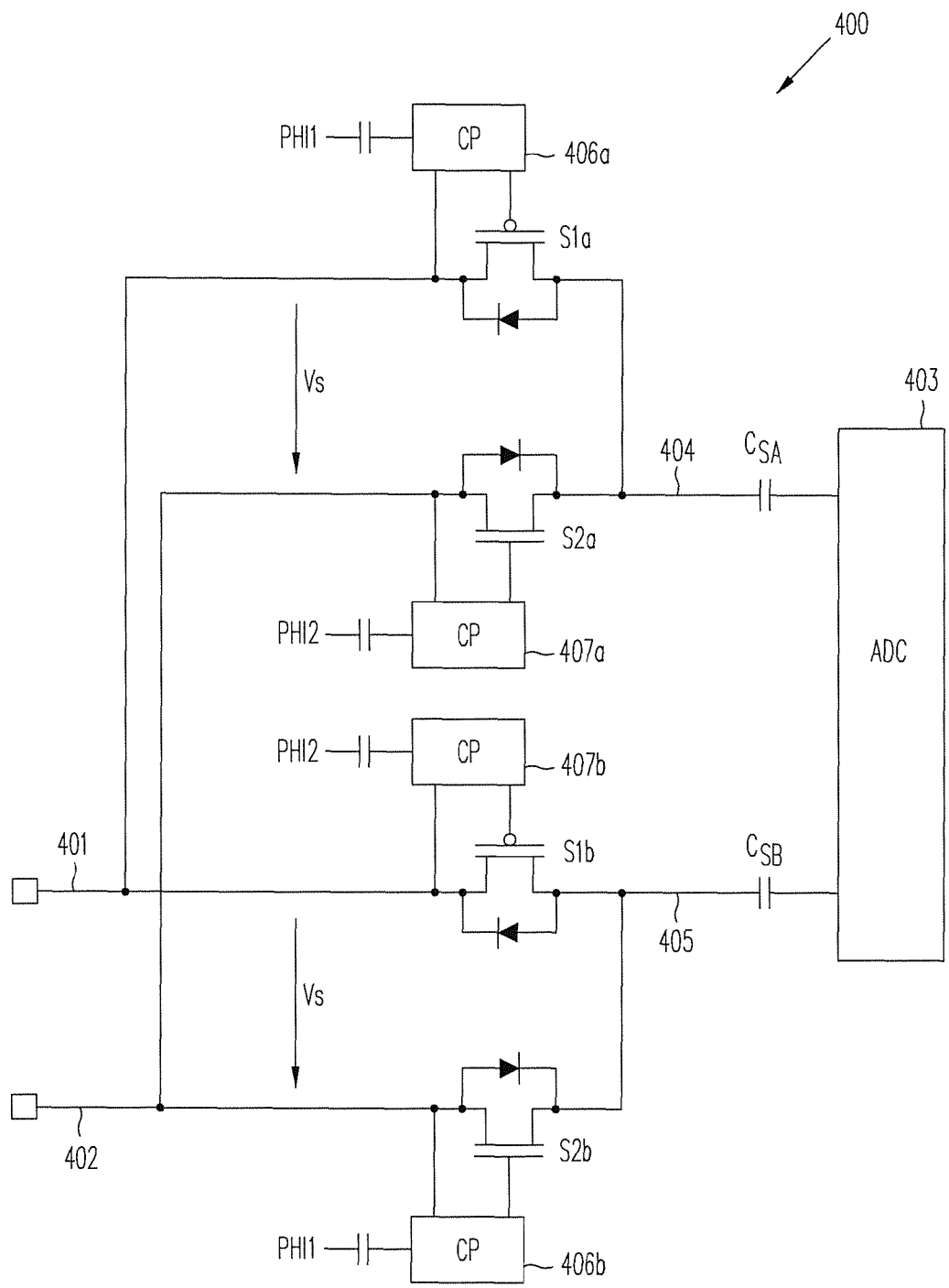
FIG. 4 is a block diagram of differential isolated ADC input sampling network 400 that can accurately sample positive input voltages, which is controlled by complementary, but non-overlapping clock signals PHI1 and PHI2.
Figure 5:
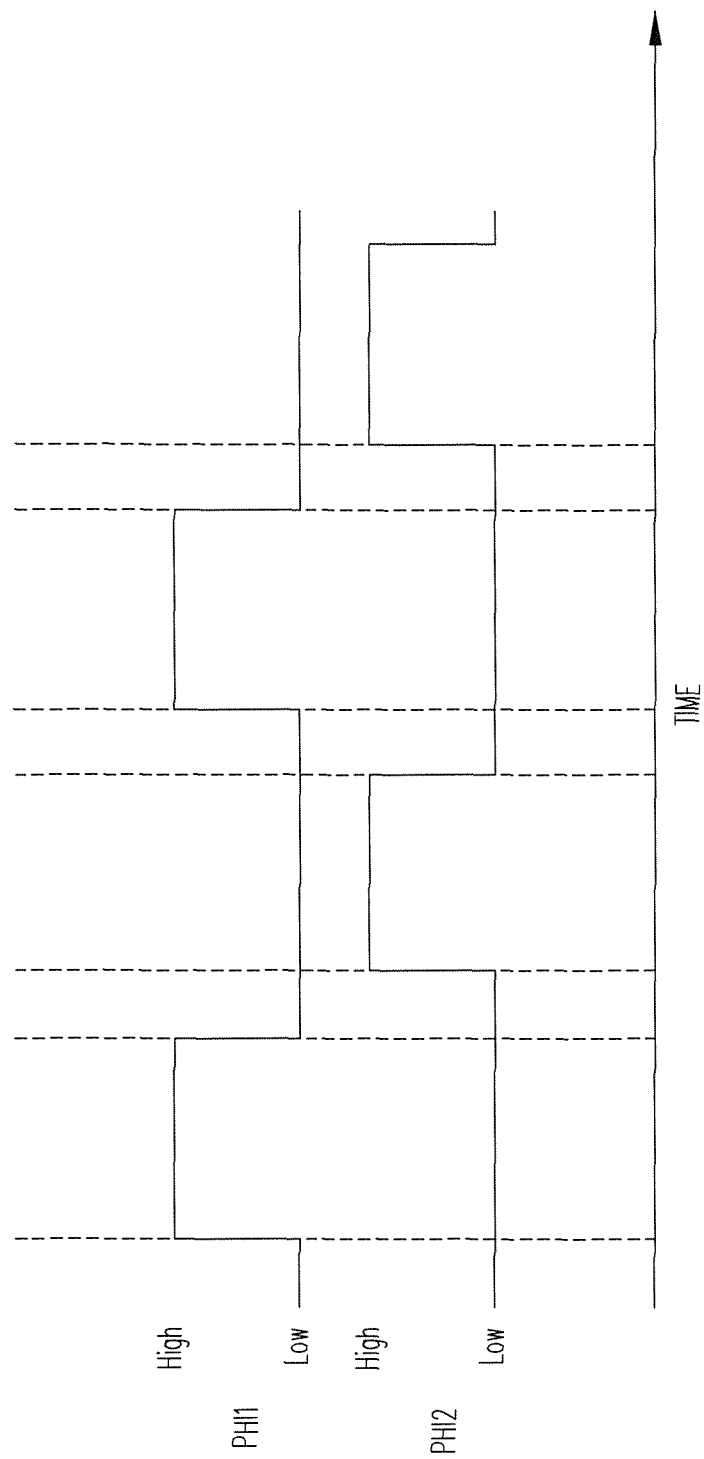
FIG. 5 shows the waveforms of clock signals PHI1 and PHI2 of FIG. 4.

FIG. 4 is a block diagram of differential isolated ADC input sampling network 400 that can accurately sample positive input voltages, which is controlled by complementary, but non-overlapping clock signals PHI1 and PHI2. The waveforms of clock signals PHI1 and PHI2 are shown in FIG. 5. As shown in FIG. 4, input sampling network 400 includes charge pump circuits 406a, 406b, 407a and 407b, switches S1a, S1b, S2a and S2b, and input sampling capacitors $C_{SA}$ and $C_{SB}$ of ADC 403. Clock signal PHI1b is the inverted signal of clock signal PHI1. Clock signal PHI2b is the inverted signal of clock signal PHI2. (Inverted signals are applied to charge pumps connected to PMOS switches because a negative gate-to-source voltage causes an PMOS switch to become conducting.) In sampling network 400, when clock signal PHI1 is at logic HIGH (i.e., "active"), switches S1a and S2b are conducting and switches S2a and S1b are non-conducting, so that differential signal Vs across input terminals 401 and 402 is presented at input terminals 404 and 405 of ADC 403. When clock signal PHI2 is active, switches S2a and S1b are conducting and switches S1a and S2b are non-conducting, so that differential signal Vs across input terminals 401 and 402 is presented in opposite polarity (i.e., −Vs) to input terminals 404 and 405 of ADC 403. Presenting the input signal in opposite polarities to ADC 403 allows offsets in the ADC circuit be canceled out, thereby enhancing accuracy. However, when input voltage Vs falls below minus one diode drop, the parasitic diodes of input sampling switches S1b and S2a at PHI1 active (or S2b and S1a at PHI2 active) become conductive, thereby causing significant sampling errors. Therefore, similar to isolated sampling network 600 of FIG. 3, the input voltage range Vs across terminals 401 and 402 in sampling network 400 is limited from minus one diode drop to plus $V_{DSMAX}$. Charge pumps 406a, 406b, 407a and 407b may be implemented in the same manner as charge pumps 402a and 402b shown in FIG. 3.

Figure 6:
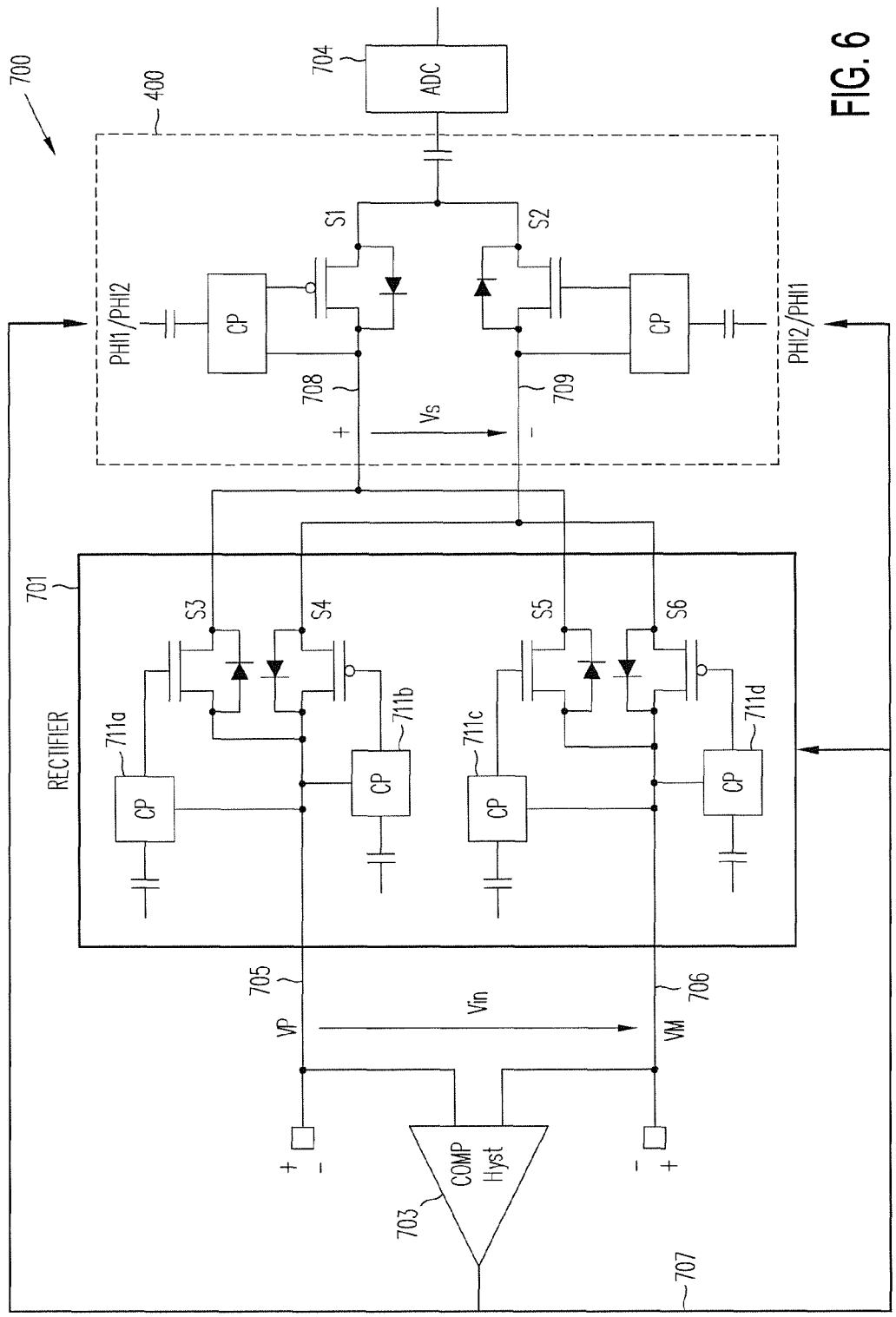
FIG. 6 is a block diagram of input sampling network 700 which includes rectifier circuit 701 that provides a positive differential signal to input sampling network 400, in accordance with one embodiment of the present invention.

According to one embodiment of the present invention, the deficiency in input sampling network 400 is overcome by ensuring that it only receives positive input signals. FIG. 6 is a block diagram of input sampling network 700 which includes rectifier circuit 701 that provides a positive differential signal to input sampling network 400, in accordance with one embodiment of the present invention. In FIG. 6, input sampling circuit 400 is shown in single-ended form for brevity. However, it is understood that input sampling network 400 may be implemented in the differential input form shown in FIG. 4. As shown in FIG. 6, polarity comparator 703 determines the polarity of input differential signal $V_{in}$ across input terminals 705 and 706. Output signal 707 of polarity comparator 703, representing the polarity determination, selectively activates switch pairs S3 and S6 or S4 and S5 through charge pumps 711a through 711d. When input differential signal $V_{IN}$ is positive, output signal 703 causes switches S3 and S6 to be conducting through the input signals to charge pumps 711a and 711d. When input differential signal $V_{IN}$ is negative, output signal 703 causes switches S4 and S5 to be conducting through the input signals to charge pumps 711b and 711c. This results in a signal inversion which would cause the ADC to sample the wrong signal polarity. The control signals to charge pumps 711a-711d may be implemented in combinational circuit by those of ordinary skill in the art. (This rectification results in a signal inversion which would cause ADC 704 to sample the wrong signal polarity.) Output signal 707 may be stored into a flip-flop or register to record a polarity of input differential signal $V_{IN}$, so as to allow proper restoration of polarity in the output value from ADC 704. Alternatively, the sampling phases of clock signals PHI1 and PHI2 at switches S1 (i.e., switches S1a and S2b of FIG. 4) and S2 (i.e., switches S2a and S1b of FIG. 4) must be exchanged to compensate for the signal inversion. Such an exchange may be implemented by multiplexers that exchanges clock signals PHI1 and PHI2. Since input signal Vs across terminals 708 and 709 may become slightly negative without causing sampling errors, polarity comparator 703 is preferably provided some hysteresis to prevent a signal that has a magnitude close to polarity comparator 703's threshold from causing too many signal inversions. Output signal 707 of polarity comparator 707 is sampled by the ADC sampling clock and therefore causes only signal inversions that are synchronous with the ADC sampling clock.

Figure 7:
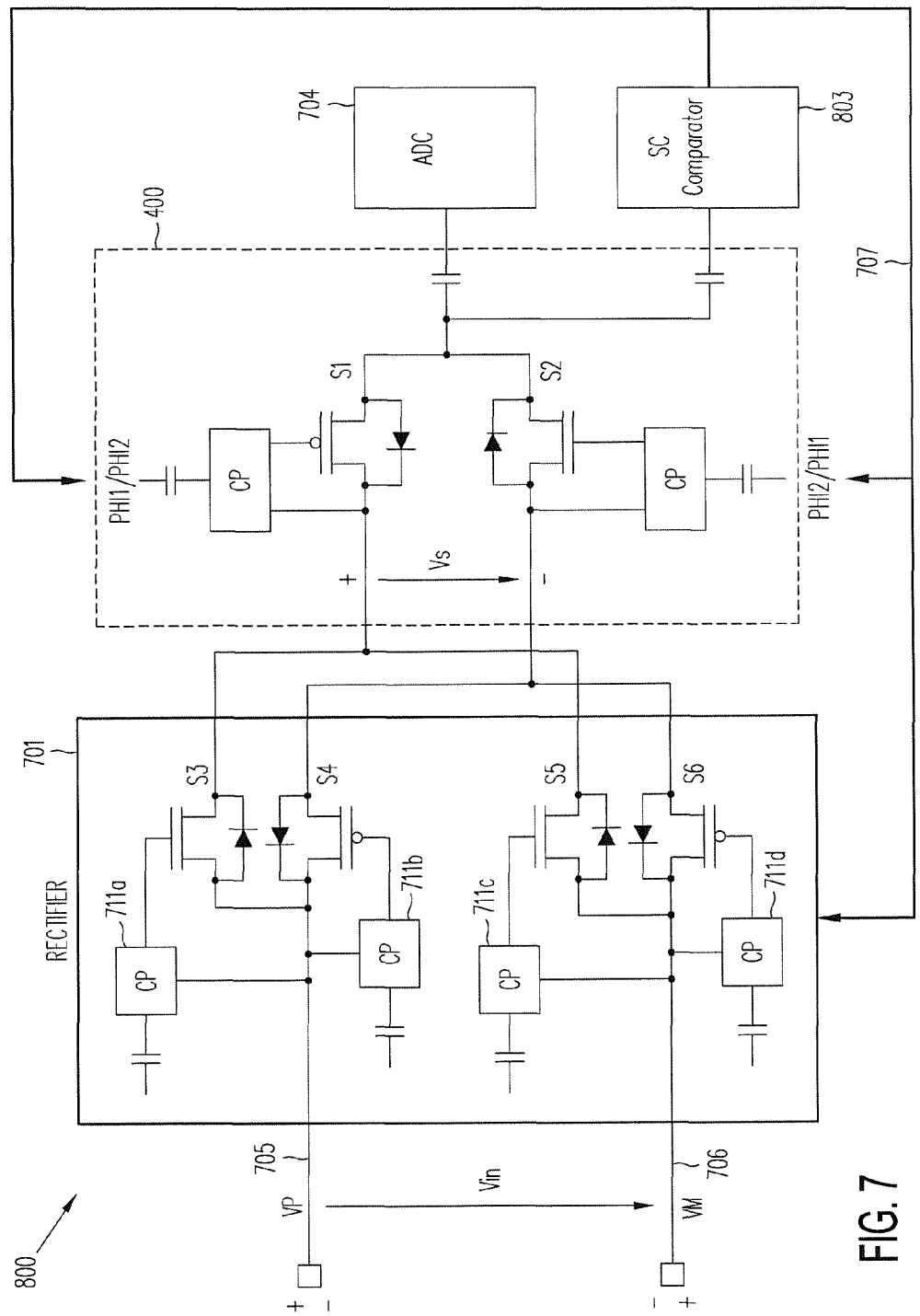
FIG. 7 is a block diagram of input sampling network 800 in which switched capacitor polarity comparator 803 detects signal polarity from the output differential signal of sampling circuit 400, in accordance with one embodiment of the present invention.

FIG. 7 is a block diagram of input sampling network 800 in which switched capacitor polarity comparator 803 detects signal polarity from the output differential signal of sampling circuit 400 by reusing switches S1 and S2 as input switches, in accordance with one embodiment of the present invention.

Accordingly, a bipolar isolated input sampling network of the present invention is capable of sampling large bipolar differential signals using isolated sampling switches. The input range is significantly extended to between $V_{DSMAX}$ and $V_{DSMAX}$. Any signal inversion in the rectifier circuit may be compensated by changing the polarity sensitivity of subsequent blocks (e.g., by swapping clock signals PHI1 and PHI2 in isolated sampling network 400 of FIGS. 6 and 7) of the ADC.

The above detailed description is provided to illustrate specific embodiments of the present invention and is not intended to be limiting. Numerous variations and modifications within the scope of the present invention are possible. The present invention is set forth in the accompanying claims.

I claim:

1. A bipolar isolated input sampling network receiving an input signal and providing a sampled signal, comprising:
    a polarity comparator that determines a polarity of the input signal;
    an isolated rectifier circuit providing a rectified input signal based on the polarity determined at the polarity comparator; and
    an isolated input sampling network receiving the rectified input signal to provide the sampled signal, wherein the input signal and the sampled signal are differential signals.

2. The bipolar isolated input sampling network of claim 1, wherein the isolated rectifier circuit comprises a first pair of isolated switches for providing the input signal as the rectified signal and a second pair of isolated switches for inverting the input signal and providing the inverted input signal as the rectified input signal.

3. The bipolar isolated input sampling network of claim 2, wherein each pair of isolated switches comprises a capacitively coupled charge pump and a transistor.

4. The bipolar isolated input sampling network of claim 1, wherein the polarity comparator determines the polarity of the input signal based on a polarity of the sampled signal.

5. The bipolar isolated input sampling network of claim 1, wherein the polarity comparator changes polarity sensitivity of one or more circuits receiving the rectified input signal.

6. The bipolar isolated input sampling network of claim 1, wherein the isolated input sampling network comprises a first pair of isolated switches for providing the rectified input signal as the sampled signal and a second pair of isolated switches for inverting the rectified signal and providing the inverted rectified signal as the sampled signal, wherein the first pair of isolated control switches is controlled by a first control signal and the second pair of isolated control switches is controlled by a second control signal.

7. The bipolar isolated input sampling network of claim 6, wherein the first control signal and the second control signal have complementary, non-overlapping waveforms.

8. The bipolar isolated input sampling network of claim 7 wherein, when the input signal is determined to be negative, phases of the first and second control signals are exchanged.

9. The bipolar isolated input sampling network of claim 6, wherein each isolated switch comprises a capacitively coupled charge pump and a transistor.

10. A method for providing a bipolar isolated input sampling network that receives an input signal and that provides a sampled signal, comprising:
- determining a polarity of the input signal;
- providing a rectified input signal based on the polarity determined; and
- in an isolated input sampling network, receiving the rectified input signal and providing the sampled signal, wherein the input signal and the sampled signal are differential signals.

11. The method of claim 10, wherein the isolated rectifier circuit provides, through a first pair of isolated switches, the input signal as the rectified signal, when the input signal is determined to be positive, and through a second pair of isolated switches, an inverted input signal as the rectified input signal.

12. The method of claim 11, wherein each pair of isolated switches comprises a capacitively coupled charge pump and a transistor.

13. The method of claim 10, wherein the polarity of the input signal is determined based on a polarity of the sampled signal.

14. The method of claim 10, further comprising changing polarity sensitivity of one or more circuits receiving the rectified signal based on the polarity of the input signal determined.

15. The method of claim 10, wherein the isolated input sampling network comprises a first pair of isolated switches for providing the rectified input signal as the sampled signal and a second pair of isolated switches for inverting the rectified signal and providing the inverted rectified signal as the sampled signal, wherein the first pair of isolated control switches is controlled by a first control signal and the second pair of isolated control switches is controlled by a second control signal.

16. The method of claim 15, wherein the first control signal and the second control signal have complementary, non-overlapping waveforms.

17. The method of claim 16, further comprises, when the input signal is determined to be negative, exchanging phases of the first and second control signals.

18. The method of claim 15, wherein each isolated switch comprises a capacitively coupled charge pump and a transistor.

* * * * *